United States Patent [19]

Kawasaki et al.

[11] 4,250,413
[45] Feb. 10, 1981

[54] CAMERA POWER SUPPLY MAINTAINING CIRCUIT

[75] Inventors: Masahiro Kawasaki; Yoshio Sawada, both of Tokyo, Japan

[73] Assignee: Asahi Kogaku Kogyo Kabushiki Kaisha, Tokyo, Japan

[21] Appl. No.: 947,314

[22] Filed: Sep. 29, 1978

[30] Foreign Application Priority Data

Oct. 4, 1977 [JP] Japan .......................... 52-133417[U]

[51] Int. Cl.³ .................... H03K 5/13; H03K 5/159
[52] U.S. Cl. ........................ 307/293; 307/294; 354/51; 354/60 R; 328/77; 328/146
[58] Field of Search .................... 328/77, 78, 146; 307/293, 294; 354/51, 60 R

[56] References Cited

U.S. PATENT DOCUMENTS

| | | | |
|---|---|---|---|
| 3,654,494 | 4/1972 | Bartlett et al. | 307/293 |
| 3,808,466 | 4/1974 | Campbell | 307/293 |
| 3,970,874 | 7/1976 | Kawasaki | 307/293 |
| 4,053,790 | 10/1977 | Myers | 307/293 |
| 4,104,547 | 8/1978 | Frederiksen et al. | 307/293 |

*Primary Examiner*—Saxfield Chatmon, Jr.
*Attorney, Agent, or Firm*—Sughrue, Rothwell, Mion, Zinn and Macpeak

[57] ABSTRACT

A power supply maintaining circuit in a camera having an electric source, and a power switch provided between the electric source and a shutter control circuit or a display circuit. The power supply maintaining circuit comprises a timer circuit connected in parallel to the shutter control or display circuit and a transistor is connected in parallel to the power switch. The transistor is controlled by the timer circuit.

7 Claims, 3 Drawing Figures

CAMERA POWER SUPPLY MAINTAINING CIRCUIT

BACKGROUND OF THE INVENTION

This invention relates to a circuit employing a semiconductor switching element for maintaining the power supply in a camera (hereinafter referred to as "a power supply maintaining circuit," when applicable).

A conventional power switch in a camera is mechanically operated that is, it is turned on by operation in association with the release button or the winding lever or a special actuation member. Some power switches are mechanically held closed for light measurement even if they are released after operation. However, this technique is disadvantageous in that, if the camera operator forgets to turn off the switch or restoring the related operating member, the battery will be unnecessarily consumed. This difficulty is multiplied because, the camera when stored will continue to drain the battery and the camera may be unusable without new batteries if the period of storage is even of moderate duration.

This disadvantage may be overcome by a method in which the power switch is coupled to a timer so that it is turned off after a predetermined period of time. Typically, the circuit according to this technique comprises a charging circuit having a capacitor and a resistor forming a timer with a given time constant, a switching element for controlling the charging circuit, and a transistor connected in series to a shutter control circuit or a display circuit. The transistor is maintained conductive (ON) until the voltage across the capacitor in the charging circuit reaches a predetermined value. The transistor is then switched (OFF) and the charging circuit is opened.

In this case, voltage drop takes place in the transistor which is a semiconductor switching element. The supply voltage of the circuit is accordingly decreased. Since in this technology requirements for a low voltage electric source has been a design criteria in contemporary cameras, the aforementioned voltage drop of the semiconductor switching element is significant. If elements such as magnets consuming a large current are employed in the shutter control circuit together with a display circuit, the base current of the semiconductor switching element, namely, the transistor is increased. Therefore if the time constant of the charging circuit is to be maintained unchanged, it is necessary to increase the capacitance of the capacitor. This technique is therefore difficult to use in a practical circuit in a contemporary camera design having large power requirements.

In view of the foregoing deficiencies in the prior art, a circuit according to this invention comprises a power switch operated in association with a release button and is connected in parallel to a semiconductor switching element. The power switch triggers a timer. Therefore, current is supplied to the semiconductor switching element only for the light measurement period during which the quantity of current consumption is relatively small. The power switch is, of course turned on during the exposure. Hence, even if current is supplied to a circuit element such as a magnet which consumes a large current, the voltage drop will not take place as in the case of the prior art, since the semiconductor switching element is shortened.

Accordingly, the amount of current driving the semiconductor switching element can be reduced, and the capacitance of the capacitor can be reduced yet achieve the same time constant. This is a significant advantage in installing the circuit in a camera.

Accordingly it is an object of this invention to provide for a circuit that minimizes power consumption in a camera.

It is another object of this invention to provide for a circuit used in cameras with a shutter control circuit or display that provides a direct timing circuit maintained in parallel between those power consuming elements to reduce transistor switching voltage drops during exposure.

These and other objects of this invention will become apparent from the drawings and the description of the preferred embodiment that follow.

DESCRIPTION OF THE PREFERRED EMBODIMENT

Figure 1:
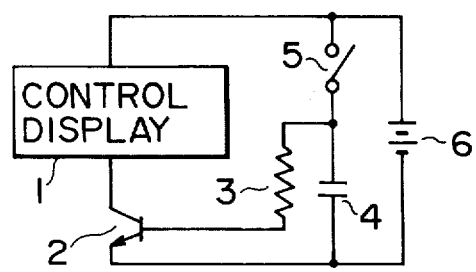
FIG. 1 shows a conventional semiconductor switching circuit.

To aid in full understanding of this invention, a conventional semiconductor switching circuit (Japenese Patent Laid-open No. 74829/1974) will be described with reference to FIG. 1. In this circuit, a series circuit of a switch 5 and a capacitor 4 is connected in parallel with an electric source 6. The connection point of the switch 5 and the capacitor 4 is connected through a resistor 3 to the base of a transistor 2. The collector of the transistor 2 is connected to a shutter control circuit and display circuit assembly 1.

The operation of the semiconductor switching circuit shown in FIG. 1 will now be described. When the switch 5 is turned on, the capacitor 4 is charged while the transistor 2 is driven through the resistor 3. As a result, current is supplied to the shutter control circuit and display circuit assembly 1. When a time, t seconds has elasped after the switch 5 is turned off, the voltage V across the capacitor 4 can be expressed by the following equation:

$$V = E \exp(-(1/CR))t \tag{1}$$

where,

E is the voltage of the electric source 6,
C is the capacitance of the capacitor 4,
R is the resistance of the resistor 3,
t is the time as described before.

Accordingly, the voltage V is gradually decreased, and will render the transistor non-conductive in a period of time. As a result, the supply of current to the shutter control circuit and display circuit assembly 1 is suspended, thus ending the timer operation. This circuit however has the problems of matching capacitor size to current loads to maintain a constant time constant.

Figure 2:
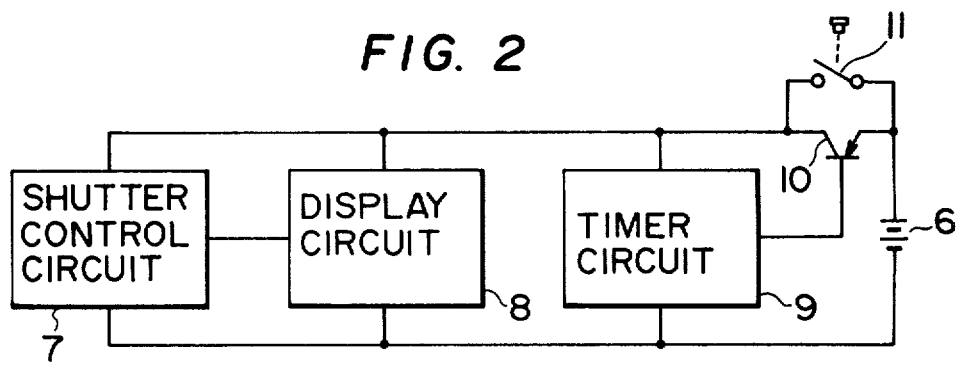
FIG. 2 is a block diagram showing one embodiment of this invention.

FIG. 2 is a block diagram showing one embodiment of this invention. A shutter control circuit 7, display circuit 8 and a timer circuit 9 are connected in parallel to one another. A parallel circuit of a transistor 10 controlled by the timer circuit 9 and a power switch 11 operated in association with a release button is connected between the timer circuit and an electric source 6.

The operation of the circuit shown in FIG. 2 will now be described. Since the power switch 11 is operated in association with the release button for the camera shutter, the switch 11 is turned on upon depression of the release button so that the shutter control circuit 7, the display circuit 8 and the timer circuit 9 are energized, as a result of which the transistor 10 is driven. Therefore, even if the release button is released, the supply of current to those circuits will continue by action of the transistor 10. Therefore power to the circuits is maintained "on". When a predetermined period of time elapses as set by the timer circuit 9, the transistor 10 is rendered nonconductive so that the supply of power to the circuits is suspended. If the release button is depressed for a period of time longer than that set by the timer circuit 9, the transistor 10 is rendered non-conductive. Therefore, in this embodiment, as soon as the release button is released, the supply of current to the circuits is suspended.

Figure 3:
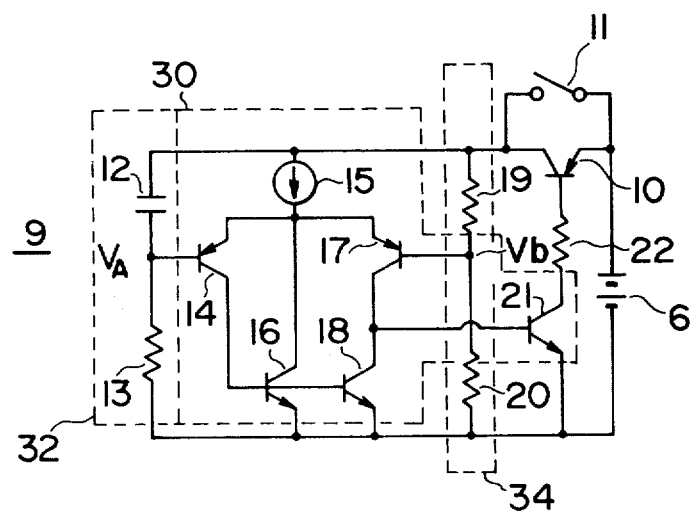
FIG. 3 is a circuit diagram showing one example of a timing circuit according to the invention.

Referring now to FIG. 3, an example of a timer circuit according to this invention is shown. Transistors 14 and 17 whose emitters are commonly connected to a constant current source 15 are driven by that constant current source. The base of transistor 14 is connected to the connection point of a capacitor 12 and a resistor 13 which forms a series circuit. The base of the transistor 17 is connected to the connection point of resistors 19 and 20 which also form a series circuit. The collector of the transistor 14 is connected to the base of transistors 16 and 18. The collector of the transistor 16 is coupled to the constant current source 15, while the collector of the transistor 17 is connected to the collector of the transistor 18 and to the base of a transistor 21. The collector of transistor 21 is connected through a resistor 22 to the base of a transistor 10 which in turn is connected in parallel to a power switch 11.

The operation of the circuit shown in FIG. 3 will now be described. The transistors 14, 16, 17, 18 and 21 and the constant current source 15 form a comparator 30. The capacitor 12 and the resistor 13 form a charging circuit 32. The resistors 19 and 20 form a reference voltage generating circuit 34.

Upon depression of the release button, the power switch 11 is closed. Therefore, the base voltage $V_A$ of the transistor 14 is changed as indicated by Equation (1) described above. This base voltage is compared with the reference voltage $V_B$ defined by the resistors 19 and 20 and taken as the base voltage of transistor 17. If $V_A > V_B$ as a result of the comparison, the transistor 14 is in cut-off state, and therefore the transistor 16 and 18 are in cut-off state. On the other hand, the transistor 17 is in an active state, driving the transistor 21 and the transistor 10. As a result, current is supplied to the timer circuit, the shutter control circuit and the display circuit through the transistor 10, and therefore even if the switch 11 is opened, the supply of current to that circuit is continued.

With the lapse of time, the capacitor 12 is charged, while the voltage $V_A$ is decreased. Thus, when $V_A \leq V_B$, the transistor 14 becomes active to drive the transistors 16 and 18. In this operation, the transistor 18 is saturated to render the transistor 21 non-conductive. Therefore, the transistor 10 is rendered non-conductive. As a result, the supply of current to the timer circuit, the shutter control circuit and the display circuit is suspended.

As is apparent from the above description, the power supply maintaining circuit according to this invention is so designed that while large current is consumed during exposure, the power switch is turned on to eliminate the voltage drop of the semiconductor switch, and the time circuit is triggered by the power switch. Therefore, the power consumption of the overall circuit is reduced.

It is apparent that variations of this invention are possible without departing from the essential scope thereof.

We claim:

1. In a power supply maintenance circuit for a camera having a source of electric power, a load and power switch provided between the electric source and the load, the improvement comprising; a timer circuit connected in parallel to said load and a switching transistor connected in parallel to the power switch, the switching of said transistor being controlled by said timer circuit; wherein said timer circuit comprises comparator means coupled to said transistor, a charging circuit coupled to said power source and said comparator means and a reference voltage generating circuit coupled to said comparator means; wherein said comparator means comprises a first transistor coupled to said switching transistor, second and third transistors having a common collector junction coupled to the base of said first transistor, a fourth transistor having its emitter coupled to the emitter of said second transistor, a fifth transistor, the collector of said fourth transistor coupled to the bases of said third and fifth transistors and, a source of constant current coupled to the emitters of second and fourth transistors.

2. The circuit of claim 1 wherein said load comprises a shutter control circuit.

3. The circuit of claim 1 wherein said load comprises a display circuit.

4. The circuit of claim 1, wherein said charging circuit comprises a capacitor and resistor in series, and wherein the base of said fourth transistor is coupled to said charging circuit.

5. The circuit of claim 4 wherein said reference voltage circuit comprises a plurality of resistors in parallel with said power supply and wherein the base of said second transistor is connected between said plurality of resistors.

6. The circuit of claim 1 wherein said comparator compares the voltage of said charging circuit with the voltage of reference voltage circuit to selectively switch the state of said switching transistor.

7. The circuit of claim 6 wherein said comparator comprises first transistor means developing a first base voltage as a function of the voltage across said charging circuit, second transistor means developing a second base voltage responsive to said reference voltage, and third transistor means responsive to said first and second base voltages for selectively changing the state of said switching transistor.

* * * * *